United States Patent [19]

Utner et al.

[11] Patent Number: 4,463,338
[45] Date of Patent: Jul. 31, 1984

[54] ELECTRICAL NETWORK AND METHOD FOR PRODUCING THE SAME

[75] Inventors: Ferdinand Utner; Harald Vetter, both of Regensburg, Fed. Rep. of Germany

[73] Assignee: Siemens Aktiengesellschaft, Berlin and Munich, Fed. Rep. of Germany

[21] Appl. No.: 291,113

[22] Filed: Aug. 7, 1981

[30] Foreign Application Priority Data

Aug. 28, 1980 [DE] Fed. Rep. of Germany ....... 3032492

[51] Int. Cl.³ .............................................. H01C 3/00
[52] U.S. Cl. ..................... 338/281; 219/552; 29/621; 338/284; 338/291; 338/287; 338/314; 338/295
[58] Field of Search .................... 338/279–283, 338/284, 287, 288, 392, 391, 217, 275, 314, 305; 219/541, 543, 548, 552; 29/611, 620, 621

[56] References Cited

U.S. PATENT DOCUMENTS

| | | | |
|---|---|---|---|
| 621,561 | 3/1899 | Freeman | 338/280 |
| 1,403,231 | 1/1922 | Churchward | 338/281 X |
| 2,680,178 | 1/1954 | Kuhn et al. | 338/281 X |
| 2,740,033 | 3/1956 | Perrine et al. | 338/281 X |
| 3,283,284 | 11/1966 | Eisler | 338/283 X |

FOREIGN PATENT DOCUMENTS 2634389 9/1971 Fed. Rep. of Germany .
1246057 6/1979 United Kingdom .

Primary Examiner—Volodymyr Y. Mayewsky
Attorney, Agent, or Firm—Herbert L. Lerner; Laurence A. Greenberg

[57] ABSTRACT

An electrical network containing at least one electric resistor, includes a support foil and at least one resistance layer coating the support foil forming the at least one electric resistor. The support foil and resistance layer are folded along a zig-zag line forming two outer surfaces of the resistance layer. Contact layers are each disposed on a different one of the outer surfaces of the resistance layer, a plastic layer is applied on the contact layers, and outer contact layers each make contact with a different one of the contact layers. A method is also provided for producing the same.

10 Claims, 5 Drawing Figures

ELECTRICAL NETWORK AND METHOD FOR PRODUCING THE SAME

The invention relates to an electrical network which contains at least one electric resistor and is constructed of a support foil coated with resistance layers and contact areas.

Such a network is known from German Patent No. DE-PS 17 65 511, which corresponds to British Pat. No. 1,246,057. In the device described in those publications, an appropriate pattern of resistance layers and conducting layers is applied to a support foil. However, such devices have not been easy to produce and have not had small dimensions and high resistances.

It is accordingly an object of the invention to provide an electrical network and method for producing the same, which overcomes the hereinafore-mentioned disadvantages of the heretofore-known devices and methods of this general type, and which is easy to produce, has small dimensions and high resistance values. The term "network" in this context also includes an individual resistor as the simplest embodiment.

With the foregoing and other objects in view there is provided, in accordance with the invention, an electrical network containing at least one electric resistor, comprising a support foil and at least one resistance layer coating the support foil forming the at least one electric resistor, the support foil and resistance layer being folded along a zig-zag line forming two outer surfaces of the resistance layer, contact layers each being disposed on a different one of the outer surfaces of the resistance layer, a plastic layer applied on the contact layers, and outer contact layers each just making contact with a different one of the contact layers.

It is known from German Pat. No. DE-PS 26 34 389 to produce a capacitor by zig-zag folding of metal-coated foils. For this purpose, the capacitor foils are folded, and each individual metal layer if the coatings is contacted by sprayed-on metal layers in the region of the folds. The metal layers of the coatings are not situated in that device in the center of the folded foil if the construction is also symmetrical. The construction shown therein is not suitable for folding resistance layers because the layers are usually brittle.

The construction according to the invention has the advantages that relatively long resistance runs can be accommodated in a resistor with very small dimensions. Therefore, relatively high resistance values can be provided without having to use excessively expensive processes for producing the resistance patterns. Furthermore, relatively wide resistance runs can also be employed, which are less prone to external damage than extremely narrow resistance runs.

The contacts are made by means of outer contact layers which are connected to contact areas, substance to substance. These contact surfaces can be made very thin. They only must ensure a durable, electrically conducting connection to the outer contact layers. They may be formed, for instance, of aluminum if the outer contact layers are to be applied by means of the Schoop flame-spraying process. If a solderable contact surface is desired, it is advisable to use copper layers as contact layers. A conductive adhesive can also be used to advantage as the outer contact layer. This is advantageous especially for high-resistance resistors, since the conductivity of such adhesives is entirely sufficient for contacting high-resistance resistors and since electrically conductive adhesives can be applied by simple means.

In accordance with another feature of the invention, there is provided a so-called chip capacitor which can be used directly in printed circuits, and in which the contact layers are partially exposed beyond the plastic layer, the support foil having rows of folded edges, each contact surface being disposed in the vicinity of one of the rows of folded edges, each of the outer contact layers enclosing a plurality of folded edges and each being only in contact with a different one of the contact layers, the other of the contact layers and the folded edges being insulated from the outer contact layers by the plastic layer. This construction ensures high strength of the network due to the clamping action of the outer contact layers, which hold each individual layer in place.

The hereinafore-mentioned plastic layer may be a laminated-on plastic foil or also a varnished-on plastic layer.

In accordance with a further feature of the invention, the plastic layer is substantially equal in thickness to the support foil, and the resistance layer is free of stretching damage caused by folding. In other words, the resistance layer is not stretched at all, or is stretched so little, by the folding operation, that it shows no cracks or other damage. This makes it possible for the resistance layer to not be stretched by the folding operation or only slightly so, so that it shows no cracks or other damage. Cracks and damage are the criterion for excessive deviations of the thickness of the plastic layer from the thickness of the support foil.

In accordance with an added feature of the invention, the resistance layer is formed of chrome-nickel and is elongated by 3% at most. Thus, cracks and other damage due to the elongation are avoided even in the case of the relatively brittle chrome-nickel layers. The thickness ratios between the support foil and the plastic layer required therefor can be determined from the bending radius due to the thickness of the support foil.

Especially in cases where a certain amount of elongation of the resistance layers is unavoidable, it is advantageous if in accordance with an additional feature of the invention, there is provided ductile metal reinforcing the resistance layer in the vicinity of the folded edges. In that case, cracks in the resistance layer cannot cause damage to the network because they are shorted by the layer of ductile metal.

Networks of the type described herein comprise individual resistors. If the networks are to comprise more than one component, it is advantageous if, in accordance with again another feature of the invention, at least two of the contact layers are adjacent to each other and the outer contact layers and have slots formed therein between the adjacent contact layers. Thus, more than two contact areas are created which are also not shorted by the outer contact layers. Between the three or more contact areas so produced, networks of any desired kind, especially of resistors, can be arranged.

Depending on the construction and the field of application, an embodiment may be particularly advantageous, in which in accordance with again a further feature of the invention, the support foil has individual folds being connected to each other material-wise and has two exposed surfaces, one of the two exposed surfaces being covered by the outer contact layers. In such a case they each take hold of a contact area. The strengthening of the capacitor is ensured herein by material-wise connections between the folds.

A network of the type thus described is advantageously integrated with other components by providing, in accordance with again an added feature of the invention, at least one further metal layer and a further plastic layer applied on the first-mentioned plastic layer, the at least one further metal layer being formed of ductile metal and forming further components, such as capacitors and/or coils, and the first-mentioned plastic layer, further plastic layer and at least one further metal layer have a combined thickness substantially equal to the thickness of the support foil. With this construction, the resistance layer is again subjected to a negligibly small mechanical stress when the folds are made. The ductile metal layer, on the other hand, can stand a substantially large elongation than the brittle resistance layer, and damage due to the folding is unlikely even if there is a major difference in the thickness between the second plastic layer and the sum total of the remaining layers. The metal layers, which are now present in different planes, can be connected to each other by various known through-hole contacting methods.

For fabricating the networks according to the invention, a method is particularly suitable, which comprises coating a support foil with at least one resistance layer forming at least one electric resistor, applying contact layers to edges of the support foil, and other layers as the case may be, applying a plastic layer leaving at least part of the contact layers exposed, folding the support foil in the longitudinal direction, applying outer contact layers forming a folded string, and subsequently separating the folded string into individual networks.

If the quantities to be produced are relatively small and if the quantity of different types of networks needed is about the same, it is advantageous if in accordance with again an additional mode of the invention, there is provided a method which comprises alternatingly generating different patterns of resistance runs on only one support foil to alternatingly generate different types of networks, and sorting out the networks in the separating process.

Networks with more than two terminals are advantageously made in accordance with a concomitant mode of the invention, by providing a method which comprises generating metal-free strips on one side of the support foil between each two adjacent contact layers, and forming a saw cut in the folded string after it is completed within the metal-free strips.

The resistance layers can be vapor-deposited or applied by a silk-screening method. The patterns can also be worked out by selective etching from metal layers which cover the entire foil. The layers can, for instance, be vapor-deposited, applied by cathode sputtering, or be printed-on.

The contacts can be made by flame-spraying or tinplating or by sliding caps onto the contact layers as well as by cementing on conductive adhesives, such as in conjunction with clamps or caps. If the network has only a few folds, an additional insulating foil can advantageously be wound-in for stiffening. The outside of the wound-in insulating foil, or even the outer layer of the support foil, may be provided with an adhesive layer, so that no additional adhesive or other fastening process is required if the networks are inserted into a larger circuit.

For better anchoring of the outer contact layer, an offset fold can be generated, i.e. the folded edges of a row are slightly offset from each other.

If the supply rolls are wider than the strip of foil required for the networks, two or more patterns of similar networks are advantageously printed-on in the direction perpendicular to the travel direction of the foil, and the foils are cut apart into corresponding strips before being folded. In this way, several network strings can be folded and simultaneously further processed.

The folded string can either be advanced in a straight line or wound on a drum with a large diameter and processed further on this drum. The individual networks are advantageously cut apart by sawing or stamping.

On the outer layer of the last layer of the support foil, trimming is possible, such as by means of a laser beam.

An unstructured foil can also be inserted into networks according to the invention. In that case, the structuring can be made subsequently by saw cuts which are brought-in from a contact layer.

By measuring the layer data of a coated support foil, the length of the networks required for a given resistance value can be determined. In the case of continuous layers, the length is proportional to the conductivity of the resistor.

An advantageous network has several parallel-connected resistors connected to each other on one side. In that case, the network is cut apart on one side, so that on one side several contact layers are generated, at which contact is made for one resistor each. On the opposite side, the second leads of all resistors are tied together.

If required, lead wires can also be attached to the outer contact layers.

Other features which are considered as characteristic for the invention are set forth in the appended claims.

Although the invention is illustrated and described herein as embodied in an electrical network and method for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
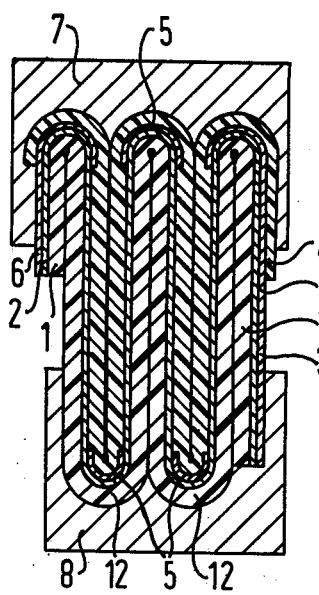
FIG. 1 is a diagrammatic cross-sectional view of a network according to the invention.

Referring now to the figures of the drawing and first particularly to FIG. 1 thereof, it is seen that a patterned resistance layer 2 is applied to a support foil 1 which is electrically insulative and foldable. Contact layers 3 and 6 are placed on this resistance layer 2, plastic layer 4 is placed on the layers 2, 3, 6, and the support foil is folded. In the region of the folded edges 12, a reinforcement 5 of ductile metal is placed on each resistance layer 2. A plastic layer 4 which is connected to these layers in close material contact, has approximately the same thickness as the support foil 1. The plastic layer 4 may be a laminated-on plastic foil or a layer applied as a varnish. The plastic layer 4 does not completely cover the contact layers 3 and 6. Outer contact layers 7 and 8 each cover a number of folded edges 12 and extend to the exposed parts of the contact layers 6 and 3, and each make contact with a different contact layer. The plastic layer 4 covers the resistance layer 2 and electrically insulates the layer 2 from the outer contact layers 7 and 8, except where the layers 3 and 6 are disposed. The layer 4 also insulates the folded parts iof the resistance layer 2 from each other.

This construction ensures that the resistance layer 2, which as a rule is relatively brittle, lies in the vicinity of the center of the fold where the fiber is least stressed when the network is folded, i.e. it is not subjected to undue tensile stresses in the vicinity of the folded edges. The reinforcement of ductile metal also makes it possible to use particularly brittle resistance layers and a certain amount of spread in the thickness of the support foil and the plastic layer, because it shorts or bridges cracks which might occur in the resistance layer.

Figure 2:
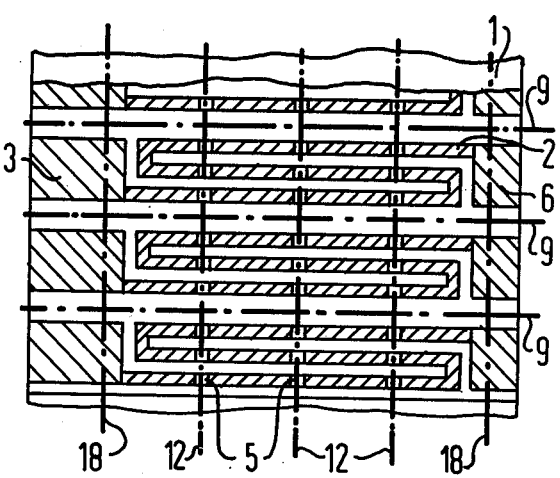
FIG. 2 is a fragmentary diagrammatic top plan view of a coated support foil for particularly high resistance values.

The contact layers 3 and 6 extend over different distances on to one of the outer surfaces of the support foil. Accordingly, the contact layers 3 and 6 have different dimensions. The plastic layer 4 accordingly leaves free strips of different widths on the two sides of the support foil; it extends up to the border lines 18 over the contact layers 3 and 6, respectively as seen in FIG. 2. In a FIG. 2, the plastic layer 4 has not been applied within the boundary lines 18. The area of the contact layers 3 and 6 covered by the plastic layer 4 advantageously extends around the nearest folded edge 12. This results in a particularly mechanically strong contact, especially if the dimensions of the network are small.

The resistance layer 2, which is meander-shaped according to FIG. 2, is suitable for providing especially high resistances, since the largest part thereof extends perpendicularly to the folded edges and since the reversal points can readily accommodated outside the folded edges. Therefore, even with a very fine construction of this pattern, no longer sections of resistance runs coincide with the folded edges 12 or the reinforcements 5 located there. After the folding and contacting of networks, the latter are separated into individual networks along the parting lines 9.

Figure 3:
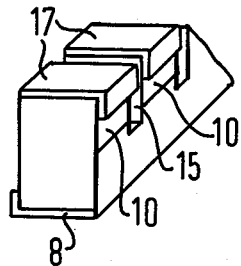
FIG. 3 is a fragmentary perspective view of a network with several leads.
Figure 4:
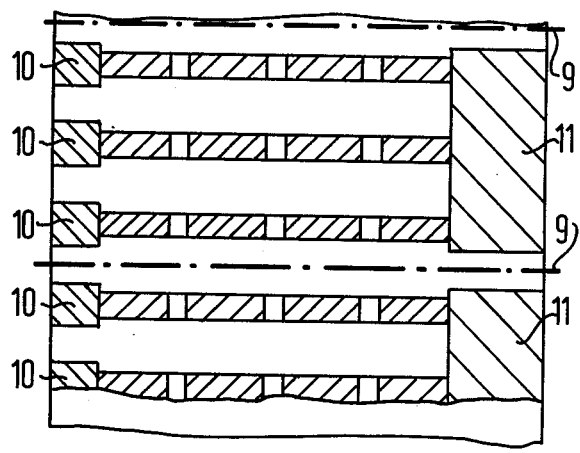
FIG. 4 is a fragmentary cross-sectional view of a foil with several parallel-connected resistors per network.

According to FIG. 3, a network is provided with several contact surfaces 10 and is contacted with outer contact layers. The contact layers are applied without interruptions. Slots 15 which are formed between each two contact surfaces 10, divide an outer contact layer 7 into several sections 17, each of which is assigned to a contact surface 10 and is insulated from the others. In this manner, a multiplicity of networks can be provided. For instance, the circuit according to FIG. 4 may be constructed, in which three resistors are respectively connected at a first side thereof to a common contact surface 11, while the second side can be connected separately by one contact surface 10 each.

Figure 5:
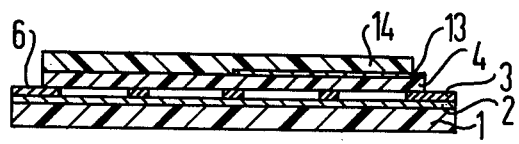
FIG. 5 is a cross-sectional view of a foil with additional layers for integrating additional components.

If other components besides resistors are also to be integrated into the network, then in accordance with FIG. 5 the plastic foil 4 is connected to a further metal layer 13 of ductile metal, and the further layer is connected to a further plastic layer 14. In this embodiment, the sum total of the plastic layers 4, the further metal layers 13 and the further plastic foil 14 is approximately equal to the thickness of the support foil 1. In this way the relatively brittle resistance layer 2 lies in the neutral fiber of the structure in this embodiment as well, and it is not stressed excessively when being folded. To make contact possible, the plastic layer 4, the metal layer 13 and the further plastic layer 14 leave a free strip at the edge on both sides of the support foil. The outer contact layers 7 and 8 (shown in FIG. 1) can therefore reach the corresponding contact layers 3, 6 after the folding. In order to allow contacting of further metal layer 13, the further plastic layer 14 does not extend to the edge of the metal layer 13. In this construction, contact can be made with this contact layer as well as through-contact with the further metal layer 13 by an outer contact layer in the region of the contact layer 3.

With resistance materials which are not too brittle, the reinforcement 5 in the vicinity of the folded edges can also include the resistance material itself. Due to the mechanical strength in the reinforced region, cracks then happen less easily.

Additional strengthening of the network is achieved if the folded edges of a row are slightly offset relative to each other.

Trimming the network, especially by varying the resistance, can be accomplished by material removal on the exposed parts of the resistance runs.

The support foil may be coated with a continuous resistance layer. In that case, the folded string can be separated at any desired point into individual resistors, and thus the resistance value can be adjusted, after the resistivity is measured in the folded string, by adjusting the length of the severed networks. In this way later trimming of the resistors to a desired value can be avoided.

There is claimed:

1. Electrical network containing at least one electric resistor, comprising a support foil formed of electrically insulative material and at least one resistance layer coating said support foil in substantially the center thereof forming the at least one electric resistor, said support foil and resistance layer being folded along a zig-zag line forming folded edges, folded parts between said folded edges and an outer surface of said resistance layer, a ductile metal layer reinforcing said resistance layer in vicinity of said folded edges, contact layers each being disposed on said outer surface of said resistance layer, a plastic layer applied on said contact layers, and outer contact layers each making contact with a different one of said contact layers, said folded parts of said resistance layer being electrically insulated from each other and said resistance layer being electrically insulated from said outer contact layers and covered by said plastic layer, except where said contact layers are disposed.

2. Electrical network according to claim 1, wherein said contact layers are partially exposed beyond said plastic layer, said support foil having rows of folded edges, each contact layer being disposed in the vicinity of one of said rows of folded edges, each of said outer contact layers enclosing a plurality of folded edges and each being in contact with a different one of said contact layers, the other of said contact layers and said folded edges being insulated from said outer contact layers by said plastic layer.

3. Electrical network according to claim 1, wherein said plastic layer is substantially equal in thickness to said support foil, and said resistance layer is free of stretching damage caused by folding.

4. Electrical network according to claim 1, wherein said resistance layer is formed of chrome-nickel and is elongated by 3% at most.

5. Electrical network according to claim 1, wherein at least two of said contact layers are adjacent to each other and said outer contact layers and have slots formed therein between said adjacent contact layers.

6. Electrical network according to claim 1, wherein said support foil has individual folds being connected to each other and has two exposed surfaces, one of said two exposed surfaces being covered by said outer contact layers.

7. Electrical network according to claim 1, including a further plastic layer applied on said first-mentioned plastic layer, said first-mentioned plastic layer, further plastic layer and ductile metal layer have a combined thickness substantially equal to the thickness of said support foil.

8. Method for producing an electrical network, which comprises coating substantially the center of a support foil formed of electrically insulative material with at least one resistance layer forming at least one electric resistor, applying contact layers to an outer surface of the resistance layer, applying a plastic layer leaving at least part of the contact layers exposed, folding the support foil in the longitudinal direction forming folded edges and folded parts between the folded edges, applying a ductile metal layer reinforcing the resistance layer in vicinity of the folded edges, applying outer contact layers forming a folded string, and subsequently separating the folded string into individual networks, the folded parts of the resistance layer being electrically insulted from each other and the resistance layer being electrically insulated from the outer contact layers and covered by the plastic layer, except where the contact layers are disposed.

9. Method according to claim 8, which comprises alternatingly generating different patterns of resistance runs on one support foil to alternatingly generate different types of networks, and sorting out the networks in the separating process.

10. Method according to claim 8, which comprises generating metal-free strips on one side of the support foil between each two adjacent contact layers, and forming a saw cut in the folded string after it is completed within the metal-free strips.

* * * * *